US011626267B2

(12) United States Patent
Zur et al.

(10) Patent No.: US 11,626,267 B2
(45) Date of Patent: Apr. 11, 2023

(54) BACK-SCATTER ELECTRONS (BSE) IMAGING WITH A SEM IN TILTED MODE USING CAP BIAS VOLTAGE

(71) Applicant: Applied Materials Israel Ltd., Rehovot (IL)

(72) Inventors: Yehuda Zur, Tel-Aviv (IL); Igor Petrov, Beer Yakov (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 140 days.

(21) Appl. No.: 17/243,478

(22) Filed: Apr. 28, 2021

(65) Prior Publication Data

US 2022/0351937 A1 Nov. 3, 2022

(51) Int. Cl.
  *H01J 37/28* (2006.01)
  *H01J 37/244* (2006.01)
  *H01J 37/20* (2006.01)
  *H01J 37/18* (2006.01)

(52) U.S. Cl.
  CPC ............. *H01J 37/28* (2013.01); *H01J 37/18* (2013.01); *H01J 37/20* (2013.01); *H01J 37/244* (2013.01); *H01J 2237/049* (2013.01); *H01J 2237/2448* (2013.01); *H01J 2237/24475* (2013.01)

(58) Field of Classification Search
  CPC .. H01J 37/28; H01J 37/18; H01J 37/20; H01J 37/244; H01J 2237/049; H01J 2237/24475; H01J 2237/2448
  See application file for complete search history.

(56) References Cited

U.S. PATENT DOCUMENTS

| 4,933,552 | A | * | 6/1990 | Lee | ................. | G01R 31/305 850/10 |
| 5,493,116 | A | * | 2/1996 | Toro-Lira | ................. | H01J 37/28 250/397 |
| 6,300,629 | B1 | * | 10/2001 | Lawrence | ............ | G01N 23/225 250/397 |

(Continued)

FOREIGN PATENT DOCUMENTS

| EP | 1648018 A1 | 4/2006 |
| WO | 2018233900 A1 | 12/2018 |
| WO | 2020082861 A1 | 4/2020 |

OTHER PUBLICATIONS

PCT/US2022/013479, "International Search Report and Written Opinion", dated May 3, 2022, 10 pages.

*Primary Examiner* — David A Vanore
(74) *Attorney, Agent, or Firm* — Kilpatrick Townsend & Stockton LLP

(57) ABSTRACT

A method of evaluating a region of a sample, the method comprising: positioning a sample within a vacuum chamber; generating an electron beam with a scanning electron microscope (SEM) column that includes an electron gun at one end of the column and a column cap at an opposite end of the column; focusing the electron beam on the sample and scanning the focused electron beam across the region of the sample, while the SEM column is operated in tilted mode, thereby generating secondary electrons and backscattered electrons from within the region; and during the scanning, collecting backscattered electrons with one or more detectors while applying a negative bias voltage to the column cap to alter a trajectory of the secondary electrons preventing the secondary electrons from reaching the one or more detectors.

20 Claims, 8 Drawing Sheets

(56) References Cited

U.S. PATENT DOCUMENTS

| | | | |
|---|---|---|---|
| 6,642,520 B2 * | 11/2003 | Kimura | H01J 37/28 |
| | | | 250/397 |
| 6,670,610 B2 | 12/2003 | Shemesh et al. | |
| 8,709,269 B2 | 4/2014 | Shemesh | |
| 10,020,164 B2 | 7/2018 | Chen et al. | |
| 10,777,382 B2 * | 9/2020 | Li | H01J 37/28 |
| 11,251,018 B2 * | 2/2022 | Sohda | H01J 37/12 |
| 11,404,244 B1 * | 8/2022 | Zur | H01J 37/244 |
| 2006/0049348 A1 | 3/2006 | Petrov et al. | |
| 2007/0194231 A1 * | 8/2007 | Nakahira | H01J 37/28 |
| | | | 250/310 |
| 2013/0214155 A1 * | 8/2013 | Winkler | H01J 37/21 |
| | | | 250/307 |
| 2019/0378682 A1 * | 12/2019 | Wang | H01J 37/285 |
| 2020/0384592 A1 * | 12/2020 | Zur | B23Q 15/22 |
| 2021/0272770 A1 * | 9/2021 | Sohda | H01J 37/244 |
| 2022/0351937 A1 * | 11/2022 | Zur | H01J 37/20 |

* cited by examiner

BACK-SCATTER ELECTRONS (BSE) IMAGING WITH A SEM IN TILTED MODE USING CAP BIAS VOLTAGE

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

When examining a sample with an electron beam from an SEM tool, secondary electrons and backscattered electrons are generated when the electron beam impinges the sample. Secondary electrons originate from the atoms of the sample itself and are a result of inelastic interactions between the electron beam and the sample. The secondary electrons are relatively low in energy (e.g., 0-20 eV) and originate from or near the surface of the sample. The backscattered electrons (BSE) are reflected back after elastic interactions between the beam and the sample. The backscattered electrons can have energy levels close to that of the electron beam and thus can come from deeper regions of the sample.

Because of these and other differences, secondary electrons and backscattered electrons can provide different types of information. Secondary electrons can provide detailed surface information about a sample while backscattered electrons show high sensitivity to differences in atomic number and are thus useful in providing material contrast when imaging a subject.

Usually, the secondary electron yield is much higher than the backscattered electron yield. Thus, when collecting backscattered electrons, the secondary electron signal needs to be suppressed in order to accurately see the backscattered electron signal. In a typical SEM tool, suppressing the secondary electron signal can be done by placing an energy filter between the sample and the detector so that the energy filter blocks the relatively low energy secondary electrons from reaching the detector. While this approach has been successfully used in the past, new method of detecting backscattered electrons are desirable.

BRIEF SUMMARY OF THE INVENTION

Some embodiments of the disclosure pertain to improved methods and techniques for collecting backscattered electrons when imaging a sample with a scanning electron microscope. The collected electrons can be used to evaluate characteristics of the sample, such as to provide material contrast.

In some embodiments, a method of evaluating a region of a sample includes: positioning a sample within a vacuum chamber; generating an electron beam with a scanning electron microscope (SEM) column that includes an electron gun at one end of the column and a column cap at an opposite end of the column; focusing the electron beam on the sample and scanning the focused electron beam across the region of the sample, while the SEM column is operated in tilted mode, thereby generating secondary electrons and backscattered electrons from within the region; and during the scanning, collecting backscattered electrons with one or more detectors while applying a negative bias voltage to the column cap to alter a trajectory of the secondary electrons preventing the secondary electrons from reaching the one or more detectors.

Various implementations of the embodiments described herein can include one or more of the following features. Generating, from the detected backscattered electrons, an image of at least a portion of the region. Applying a negative bias to the column cap negative 50 and negative 1000 volts. Applying a negative bias to the column cap between negative 100 and negative 500 volts. The column cap can have a conical shape with an opening at its tip and the electron beam can be directed through the opening. The backscattered electrons can be collected with an in-lens detector and a top detector. The backscattered electrons can be collected with an external detector.

Some embodiments pertain to a non-transitory computer-readable medium that stores instructions for performing x-ray spectroscopy surface material analysis of a region of a sample according to any of the methods above or herein. For example, by: positioning a sample within a vacuum chamber; generating an electron beam with a scanning electron microscope (SEM) column that includes an electron gun at one end of the column and a column cap at an opposite end of the column; focusing the electron beam on the sample and scanning the focused electron beam across the region of the sample, while the SEM column is operated in tilted mode, thereby generating secondary electrons and backscattered electrons from within the region; and during the scanning, collecting backscattered electrons with one or more detectors while applying a negative bias voltage to the column cap to alter a trajectory of the secondary electrons preventing the secondary electrons from reaching the one or more detectors.

Some embodiments pertain to a system for performing x-ray spectroscopy surface material analysis of a region of a sample according to any of the methods set forth above or herein. For example, the system can include: a vacuum chamber; a sample support configured to hold a sample within the vacuum chamber during a sample evaluation process; a scanning electron microscope (SEM) column configured to direct a charged particle beam into the vacuum chamber toward the sample, the SEM column including an electron gun at one end of the column and a column cap at an opposite end of the column; a detector configured to detect backscattered electrons; and a processor and a memory coupled to the processor. The memory can include a plurality of computer-readable instructions that, when executed by the processor, cause the system to: position a sample within a vacuum chamber; generating an electron beam with a scanning electron microscope (SEM) column that includes an electron gun at one end of the column and a column cap at an opposite end of the column; focus the electron beam on the sample and scanning the focused electron beam across the region of the sample, while the SEM column is operated in tilted mode, thereby generating secondary electrons and backscattered electrons from within the region; and collect backscattered electrons with one or more detectors while applying a negative bias voltage to the column cap to alter a trajectory of the secondary electrons preventing the secondary electrons from reaching the one or more detectors.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to improved methods and techniques for collecting backscattered electrons when imaging a sample with a scanning electron microscope.

Example Sample Evaluation Tool

Figure 1:
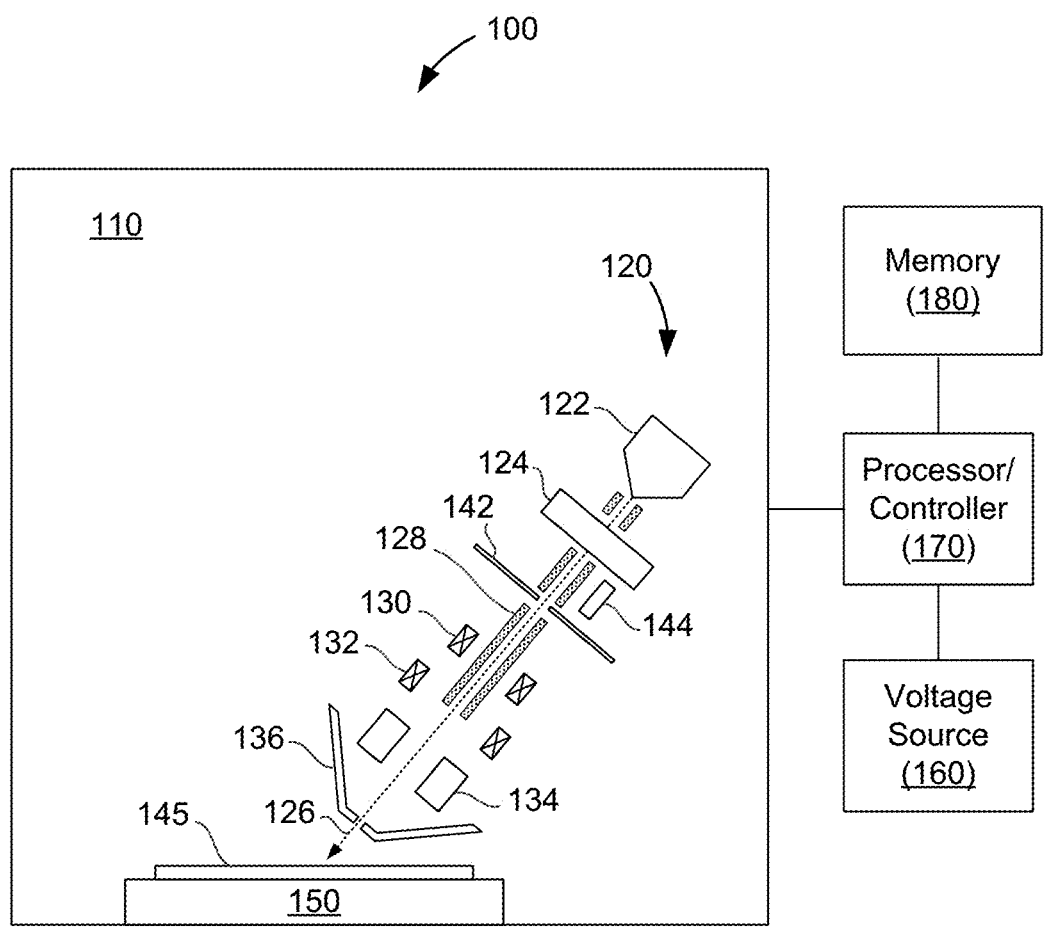
FIG. 1 is simplified illustration of a sample evaluation system according to some embodiments of the disclosure.

In order to better understand and appreciate the disclosure, reference is first made to FIG. 1, which is a simplified schematic illustration of a sample evaluation system 100 according to some embodiments of the disclosure. Sample evaluation system 100 can be used for, among other operations, defect review and analysis of structures formed on samples, such as semiconductor wafers.

System 100 can include a vacuum chamber 110 along with a scanning electron microscope (SEM) column 120. A supporting element 150 can support a sample 145 (e.g., a semiconductor wafer) within chamber 110 during a processing operation in which the sample 145 (sometimes referred to herein as an "object" or a "specimen") is subject to a charged particle beam 126 from the SEM column.

SEM column 120 is connected to vacuum chamber 110 so that charged particle beam generated by the column propagates through a vacuumed environment formed within vacuum chamber 110 before impinging on sample 145. SEM column 120 can generate an image of a portion of sample 145 by illuminating the sample with charged particle beam 126, detecting particles emitted due to the illumination, and generating charged particle images based on the detected particles. Towards this end, SEM column 120 can include an electron beam source 122 (i.e., an "electron gun"), an anode tube 128 that defines the electron beam drift space, a condenser lens arrangement 124, one or more deflecting lenses, such as lenses 130, 132, one or more focusing lenses 134, and a column cap 136.

During an imaging process, electron beam source 122 generates an electron beam 126 that passes through and is initially converged by the condenser lens 124 and then focused by lenses 134 before hitting the sample 145. Condenser lens 124 defines the numerical aperture and current of the electron beam (together with the final aperture) which is directly related to the resolution, while focusing lenses 134 focus the beam onto the sample. Column cap 136, which is located between the lower end of anode tube 128 (a first electrode) and the sample 145 (a second electrode) can be a third electrode in the system that regulates the electric field created within the vicinity of the wafer.

The particle imaging process typically includes scanning a charged particle beam back-and-forth (e.g., in a raster or other scan pattern) across a particular area of the sample being imaged. Deflecting lenses 130, 132, which can be magnetic lenses, electrostatic lenses or a combination of both electrical and magnetic lenses, can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

SEM column 120 can also include one or more detectors to detect charged particles generated from the sample during an imaging process. For example, SEM column 120 can include an in-lens detector 142 and a top detector 144 that can be configured to detect secondary and backscattered electrons emitted as a result of an illumination of the sample by charged particle beam 126. In-lens detector 142 can include a central hole that allows charged particle beam 126 to pass through the detector and allows both secondary electrons and backscattered electrons that enter the charged particle column 120 to pass through detector 142 to top detector 144. In some embodiments, sample evaluation system 120 can also include an external detector (discussed below with respect to FIG. 6) that can also be configured to detect secondary and backscattered electrons.

Additionally, system 100 can include a voltage supply source 160 and one or more controllers 170, such as a processor or other hardware unit. Voltage supply source can be operated to provide a desired effective voltage of the column to thereby improve the image resolution. This can be achieved by appropriate distribution of the voltage supply between the first and second electrodes (i.e., between the anode tube and the sample). Controller(s) 170 can control the operation of system, including the voltage supply source 160, by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

As shown in FIG. 1, embodiments allow SEM column 120 to be tilted at a non-vertical angle with respect to sample 145. For example, as shown in FIG. 1, column 120 can be tilted at a 45 degree angle with respect to an upper, substantially planar surface of sample 145. To enable column 120 to be tilted, cap 136 can have a conical shape that enables the column to be positioned very close to sample 145 without the column cap 136 colliding with the sample. Additionally, and as discussed below, in some embodiments, SEM column 120 does not include an energy filter that is used by some SEM tools to prevent secondary electrons from reaching the in-lens detector 142. Alternatively, in some embodiments, SEM column 120 can include an energy filter but can be used to evaluate a sample without the energy filter being activated.

Challenges in Collecting Backscattered Electrons

Figure 2:
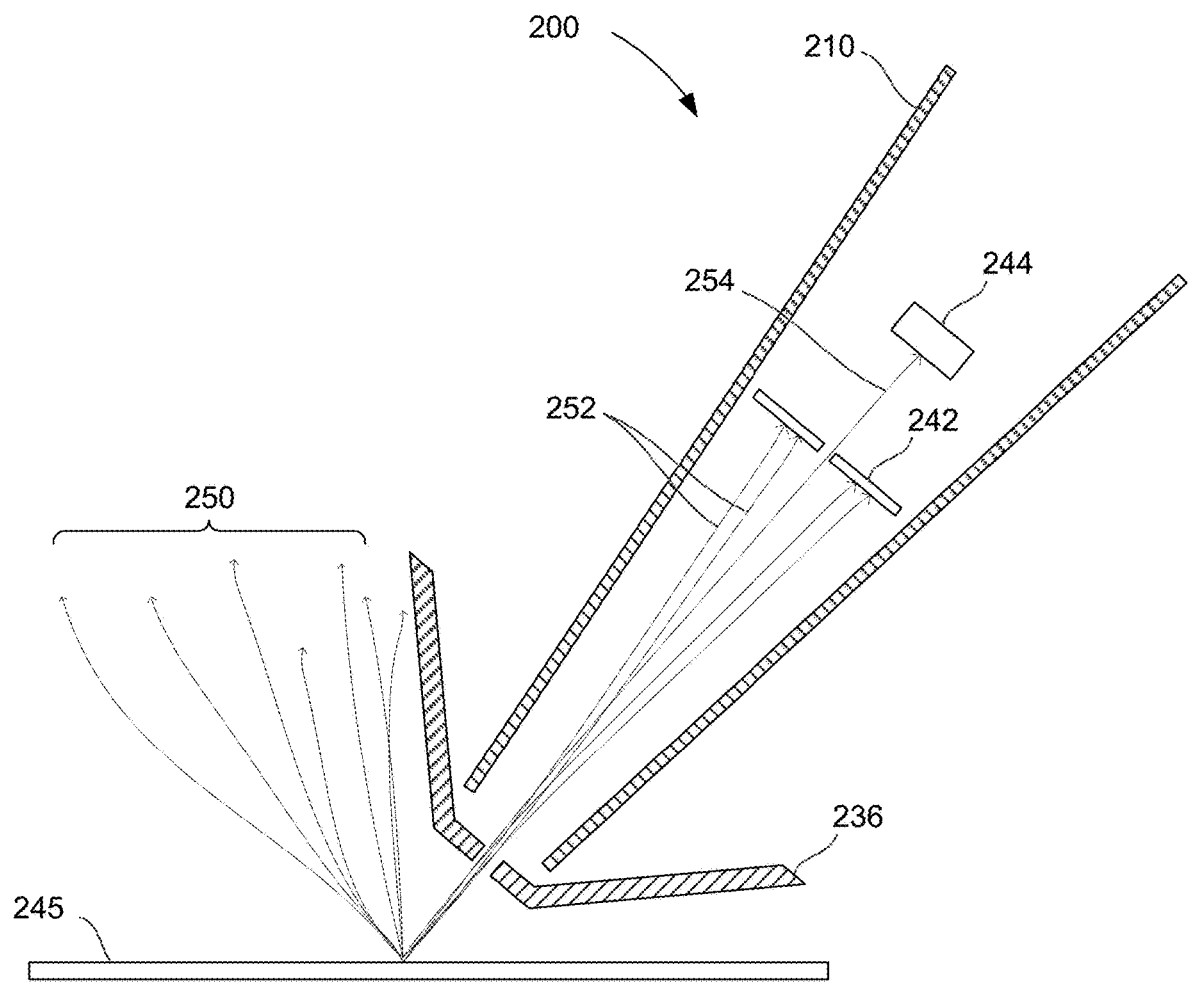
FIG. 2 is simplified illustration depicting example paths of backscattered electrons generated from a sample when an electron beam generated by an SEM column impinges the sample.

As mentioned above, some embodiments collect backscattered electrons without using an energy filter to suppress the secondary ion signal. To better appreciate the advantages and benefits of some embodiments, reference is made to FIG. 2, which is a simplified schematic view of a portion of an SEM column 200 spaced apart from a sample 245. SEM column 200 can be representative of SEM column 120 shown in FIG. 1. For ease of illustration, only selected elements of SEM column 200 are shown in FIG. 2. As shown, the SEM column 200 includes a column cap 236 at the distal end of the column, an in-lens detector 242 and a top detector 244. Also shown is a portion of an anode tube 210.

During an imaging operation, the SEM column 200 generates an electron beam (not shown) and directs the electron beam such that the beam impinges sample 245. The interaction of the electron beam with the sample 245 generates various secondary and backscattered electrons that travel away from the sample in all directions. The paths of some of the generated electrons are shown as paths 250, paths 252 and path 254. As shown, some generated electrons travel along paths 250 travel away from the SEM column and thus cannot reach either of the detectors 242 or 244, some of the generated electrons travel along paths 252 that enter the SEM column on a trajectory such that the electrons impinge upon in-lens detector 242, and some of the generated electrons travel along path 254 that enter the SEM column on a trajectory that enables the electrons to pass through the center opening of the in-lens detector 242 to reach top detector 244.

Figure 3:
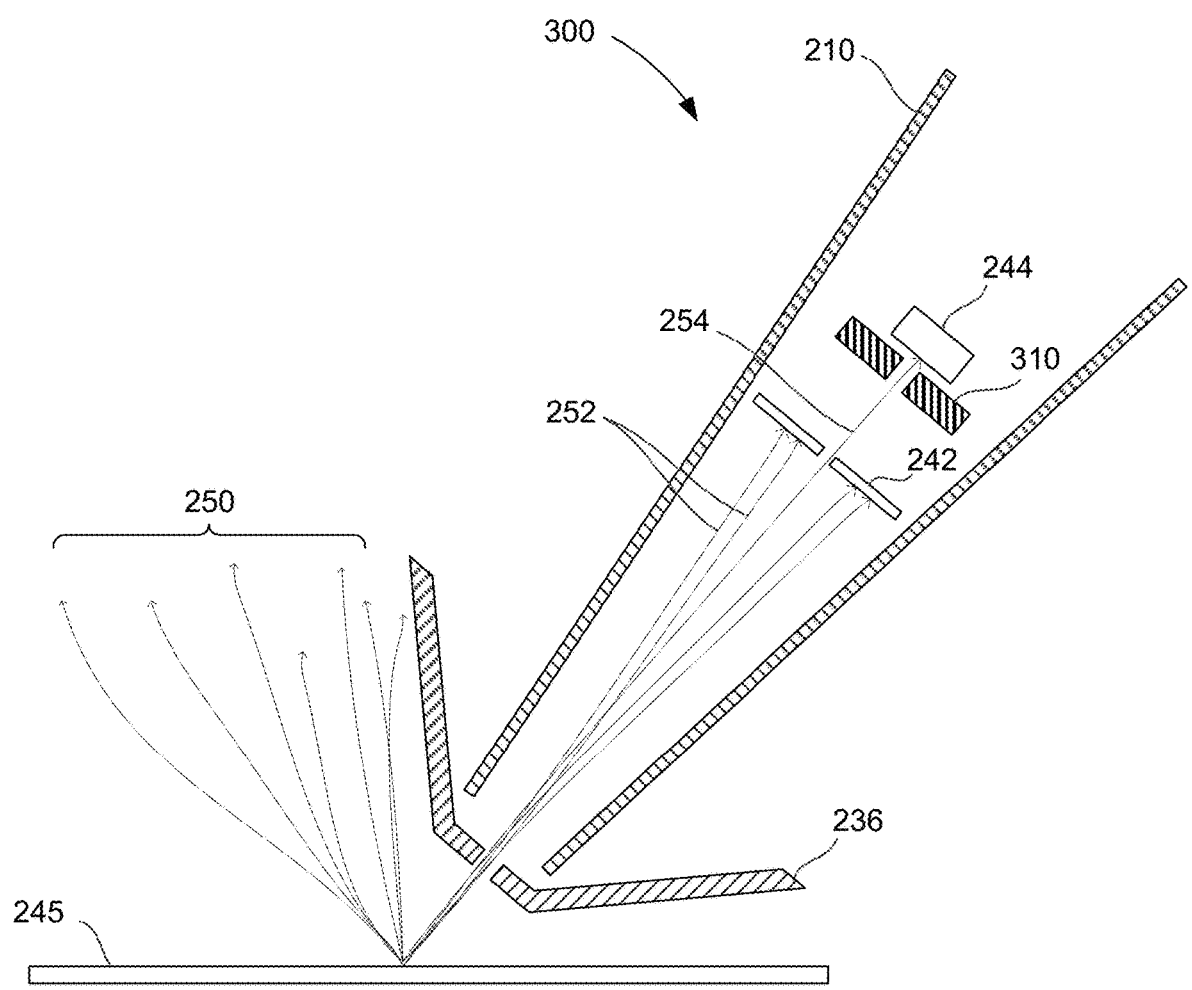
FIG. 3 is simplified illustration depicting the placement of an energy filter in an example of a previously known SEM column.

In some previously known SEM tools that are set to collect backscattered electrons, an SEM column includes an energy filter 310 as shown in FIG. 3. Energy filter 310, which can separate backscattered electrons from secondary electrons by preventing electrons below a predetermined energy level from passing the filter, is typically positioned just before top detector 244. Thus, an evaluation system that includes SEM column 300 can only see backscattered electrons that follow path 254 and reach the top detector 244. Electrons that travel along path 252 and reach detector 242 will include both secondary electrons and backscattered electrons. Since the detector 242 cannot distinguish between the different types of electrons, in-lens detector 242 cannot be used to isolate the backscattered electron signal from the secondary electron signal. Additionally, backscattered electrons that follow path 250 will not reach either of detectors 242 or 244.

Applying a Negative Bias to the Column Cap

According to some embodiments disclosed herein, an SEM column (e.g., column 120 or 200) can be operated in tilt mode (e.g., at a 45 degree angle, or other non-vertical angle, to the sample) and a negative bias voltage can be applied to the column cap during the imaging process to suppress the secondary electrons from reaching any of electron detectors (including in-lens detector 142, 242 and top detector 144, 244 which are further from the sample than the column cap.

Figure 4:
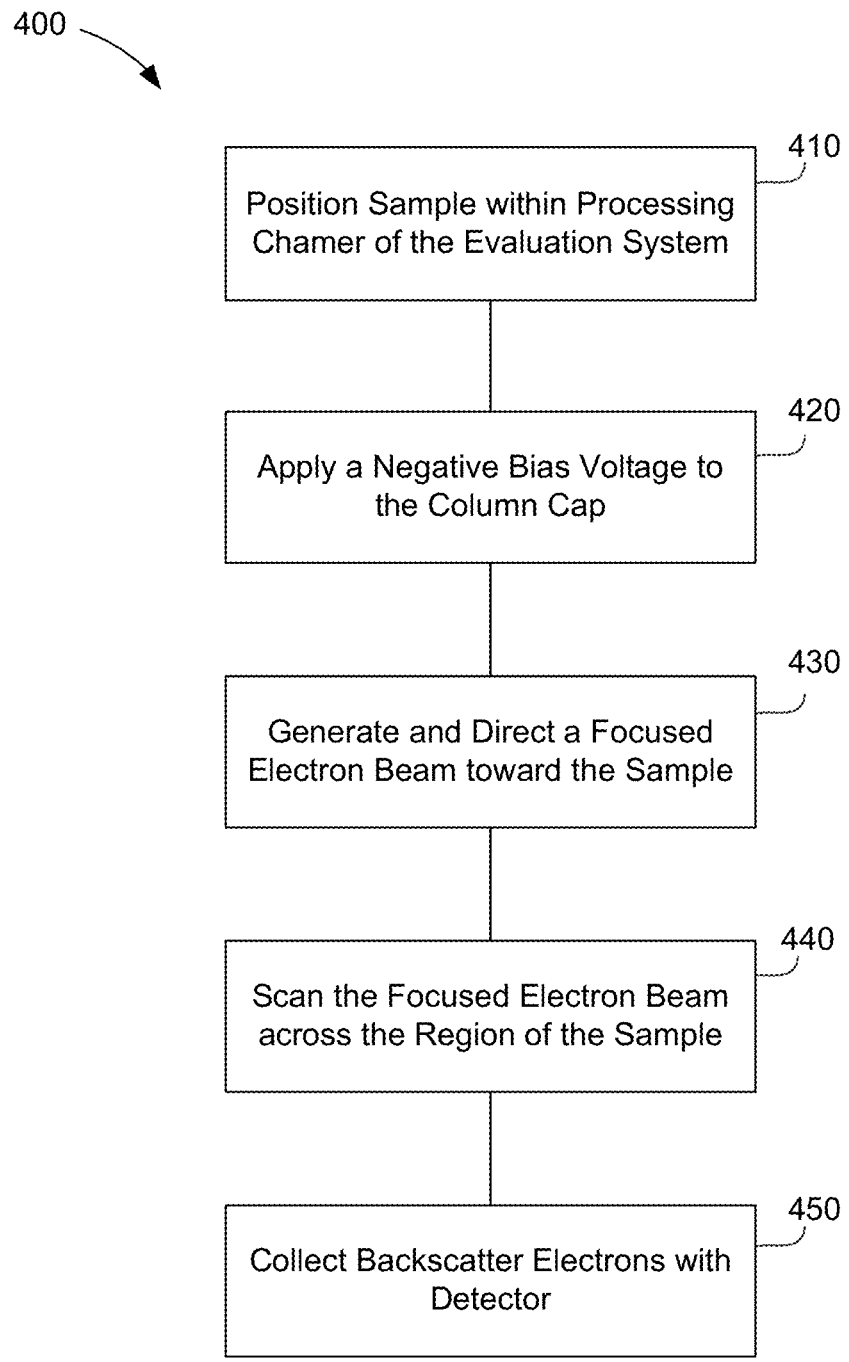
FIG. 4 is a simplified flowchart depicting steps associated with some embodiments according to the disclosure.

FIG. 4 is a simplified flow chart depicting steps associated with a method 400 of imaging a sample according to some embodiments. Method 400 starts by positioning a sample within a processing chamber of a sample evaluation system (step 410). The processing chamber, which can be, for example, chamber 110, can include an SEM column that can be operated in tilted mode and one or more electron detectors, such as in-lens detector 142 or top detector 144. Step 410 can include positioning a sample, such as sample 145, within the vacuum chamber on a sample support, such as support 150.

Next, a negative bias voltage is applied to the column cap (step 420) and the SEM column can be activated to generate an electron beam (step 430) that is focused and scanned across a region of interest on the sample (step 440). The electron beam can be focused by a focusing lens, such as lens 134, and scanned across a region of the substrate with one or more deflecting lenses, such as lenses 130 and 132.

While the electron beam is scanned across the region of interest, the negative bias voltage is applied to the column cap. The negative bias voltage should to be sufficiently high to suppress the secondary electrons but it should not be so high as to impact the electron beam 126 which would adversely impact resolution of the imaging process. While the negative bias voltage is applied to the column cap, and while the electron beam is scanned across the region of interest, backscattered electrons can be collected with an appropriate detector, such as in-lens detector 142 or top detector 144 (step 450). In actual implementation, steps 430, 440 and 450 can occur essentially simultaneously and can be extremely fast.

In some embodiments, the negative bias voltage can be the minimum voltage that is required to suppress the secondary electrons. Suitable values of the negative bias voltage will depend, in part, on the geometry of the column cap, and can be determined by simulations or by experiments as can be readily determined by a person of skill in the art. In some embodiments, the bias voltage can be between negative 50 and negative 1000 volts; and in other embodiments the bias voltage can be between negative 100 and negative 500 volts.

Figure 5A:
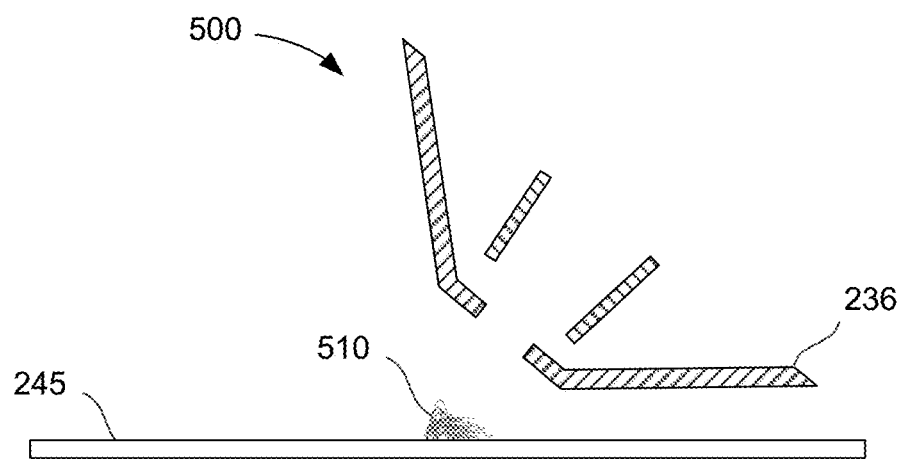
FIG. 5A is a simplified diagram depicting an example of the impact to trajectories of secondary electrons when a negative bias voltage is applied to a column cap according to some embodiments.
Figure 5B:
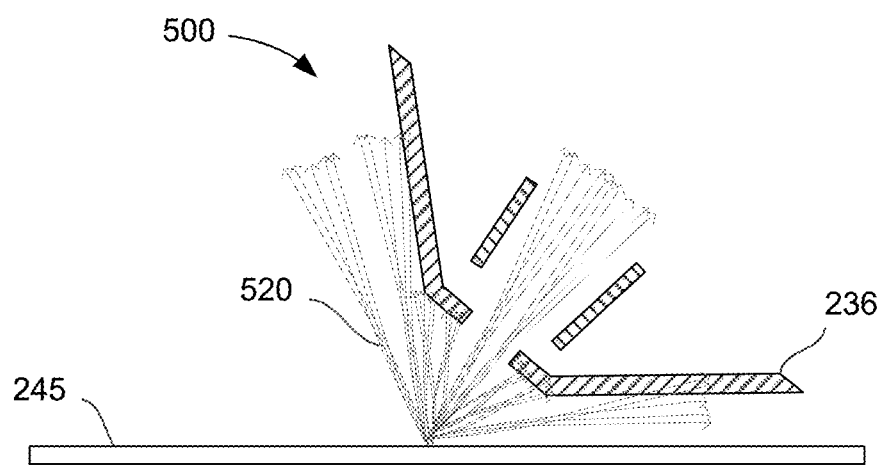
FIG. 5B is a simplified diagram depicting an example of the impact to trajectories of backscattered electrons when a negative bias voltage is applied to a column cap according to some embodiments.

FIGS. 5A and 5B are simplified drawings that illustrate the impact of applying a negative bias to the cap of an SEM column 500 according to some embodiments. SEM column 500 can be representative of SEM column 120 or 200 discussed above. Specifically, FIG. 5A depicts the impact that applying a negative voltage of 200 volts to a cap 236 of SEM column 500 has on secondary electrons 510 generated during a imaging operation and FIG. 5B depicts the impact that applying the same negative voltage (200 volts) to cap 236 has on backscattered electrons 520. In each of FIGS. 5A and 5B, SEM column 500 generates a 1 kV electron beam during the imaging process.

As is evident from a comparison of FIGS. 5A and 5B, which are based on simulation results, the negative voltage repels the lower energy secondary electrons so that none of the secondary electrons 510 pass into SEM column 500. Thus, applying the negative cap voltage ensures that none of the secondary electrons 510 can reach either an in-lens or top detector (not shown in FIG. 5A or 5B) within the column 500. In contrast, applying the negative voltage to cap 236 has minimal impact on the higher energy backscattered electrons 520. Thus, some of the backscattered electrons travel along paths that enter the SEM column reaching one of the in-lens or top detectors and enabling the in-lens detector inside the column to provide a backscattered signal without the use of a separate filter.

Figure 6A:
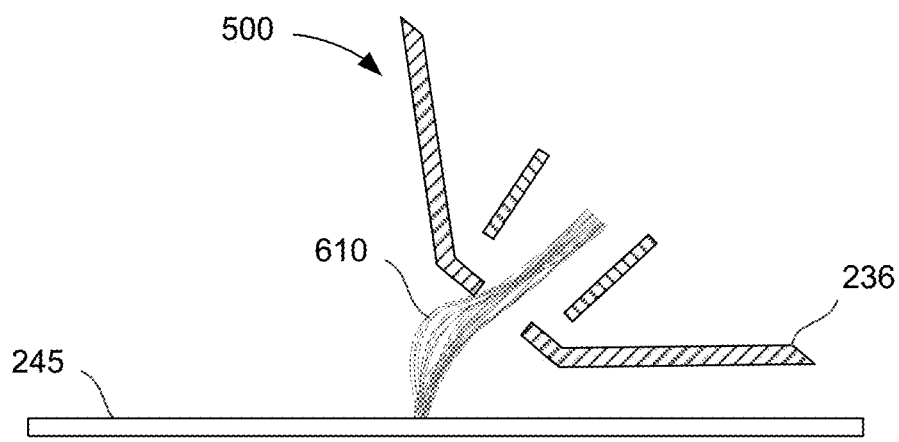
FIG. 6A is a simplified diagram depicting example trajectories of secondary electrons when no bias voltage is applied to a column cap.
Figure 6B:
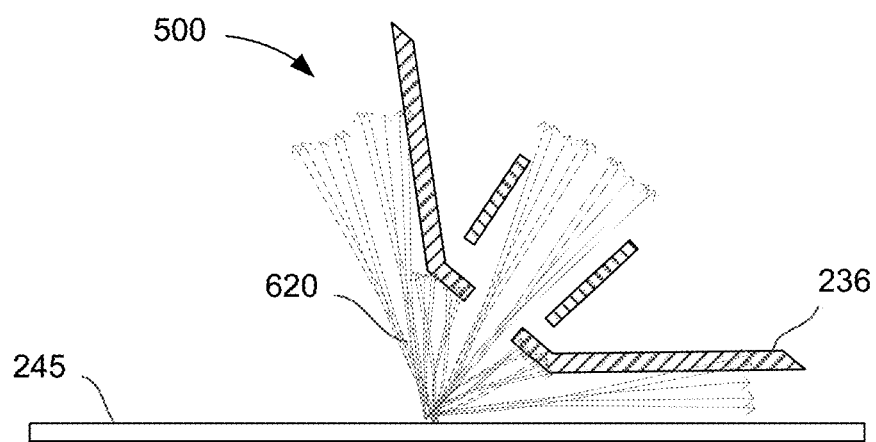
FIG. 6B is a simplified diagram depicting example trajectories of backscattered electrons when no bias voltage is applied to a column cap.

FIGS. 6A and 6B are simplified drawings of a portion of SEM column 500 that illustrate example paths of electrons generated during an imaging when no bias (i.e., a bias of 0 volts) is applied to the electron cap. Specifically, FIG. 6A depicts example trajectories of secondary electrons 610 when no bias voltage is applied to cap 236 and FIG. 6B depicts example trajectors of backscattered electrons 620 when no bias is applied to cap 236. As can be seen in FIG. 6B, the trajectory of the backscattered electrons 620 is substantially the same as the trajectory as backscattered electrons 520 shown in FIG. 5B when the 200 negative volt bias was applied to the cap. As shown in FIG. 6A, however, without a negative bias on the cap, some secondary electrons 610 enter the SEM column 500 can thus reach one of the in-lens or top detectors. Since the detectors cannot distinguish between the secondary electrons and backscattered electrons, the secondary electrons pollute the signal at the detectors preventing an accurate backscattered signal from being obtained.

Sample Evaluation Tool with an External Detector

Figure 7:
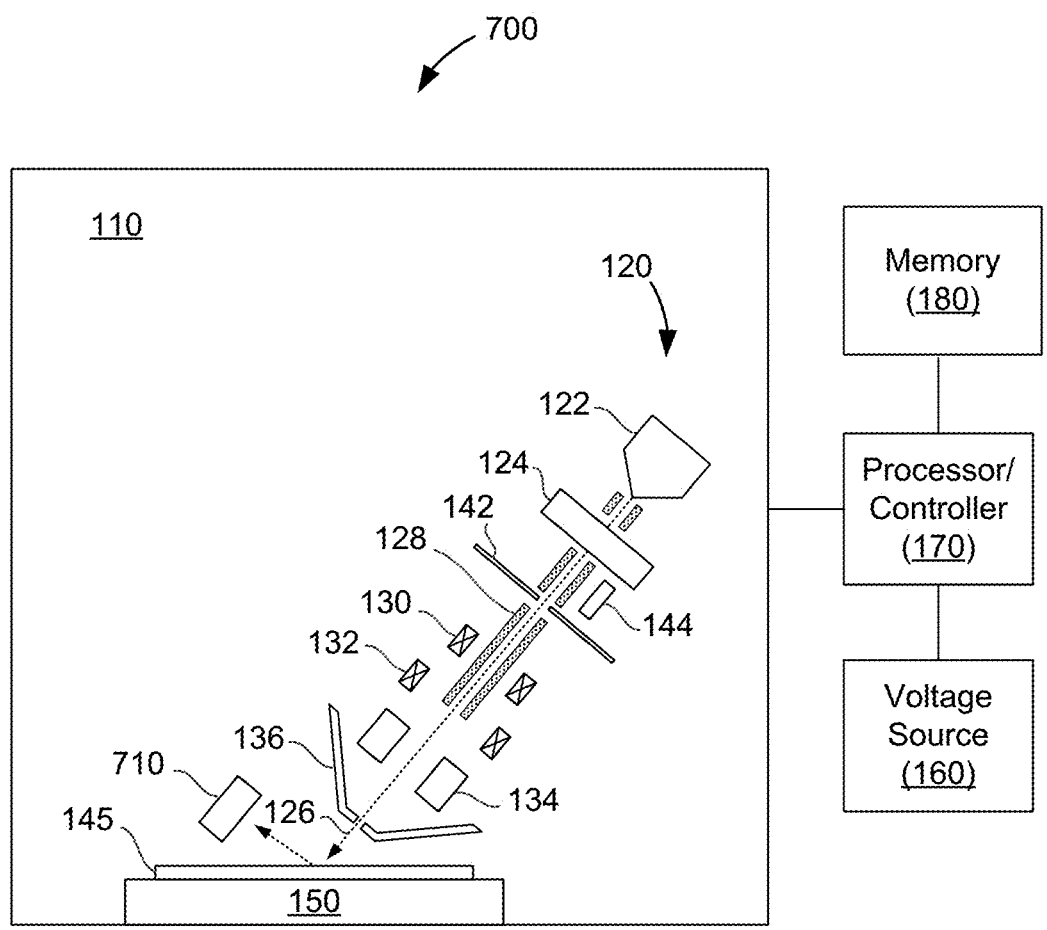
FIG. 7 is simplified illustration of a sample evaluation system that includes an external detector according to some embodiments of the disclosure.

Sample evaluation systems according to some embodiments can include an external detector that can be used to detect backscattered electrons. The external detector can be in addition to or instead of one or both of the in-lens detector and top detector discussed above. FIG. 7 is a simplified schematic illustration of a sample evaluation system 700 according to some embodiments of the disclosure. Sample evaluation system 700 can be similar to evaluation system 100 except that it includes an external detector 710. For convenience, other elements of evaluation system 700 that are similar to those of evaluation system 100 have been labeled with the same reference numbers and are not discussed below.

During a sample evaluation process SEM column 120 in evaluation system 700 can tilted with respect to sample 145 as discussed above with respect to FIG. 1. As shown in FIG. 7, external detector 710 can be spaced apart from cap 136 of the SEM column and positioned to collect electrons generated from sample 145 when the sample is bombarded with electron beam 126. While in-lens detector 142 and top detector 144 are limited to detecting backscattered electrons that enter the SEM column through the opening of cap 136, external detector 710 can detect backscattered electrons that have trajectories that take the electrons away from the SEM column. Embodiments can apply a negative voltage to cap 136 during the imaging process to suppress the secondary electron signal (i.e., prevent the secondary electrons from reaching external detector 710) and ensure that the external detector 710 collects a signal that includes primarily, or only, backscattered electrons.

Example of a Sample to be Imaged

Figure 8:
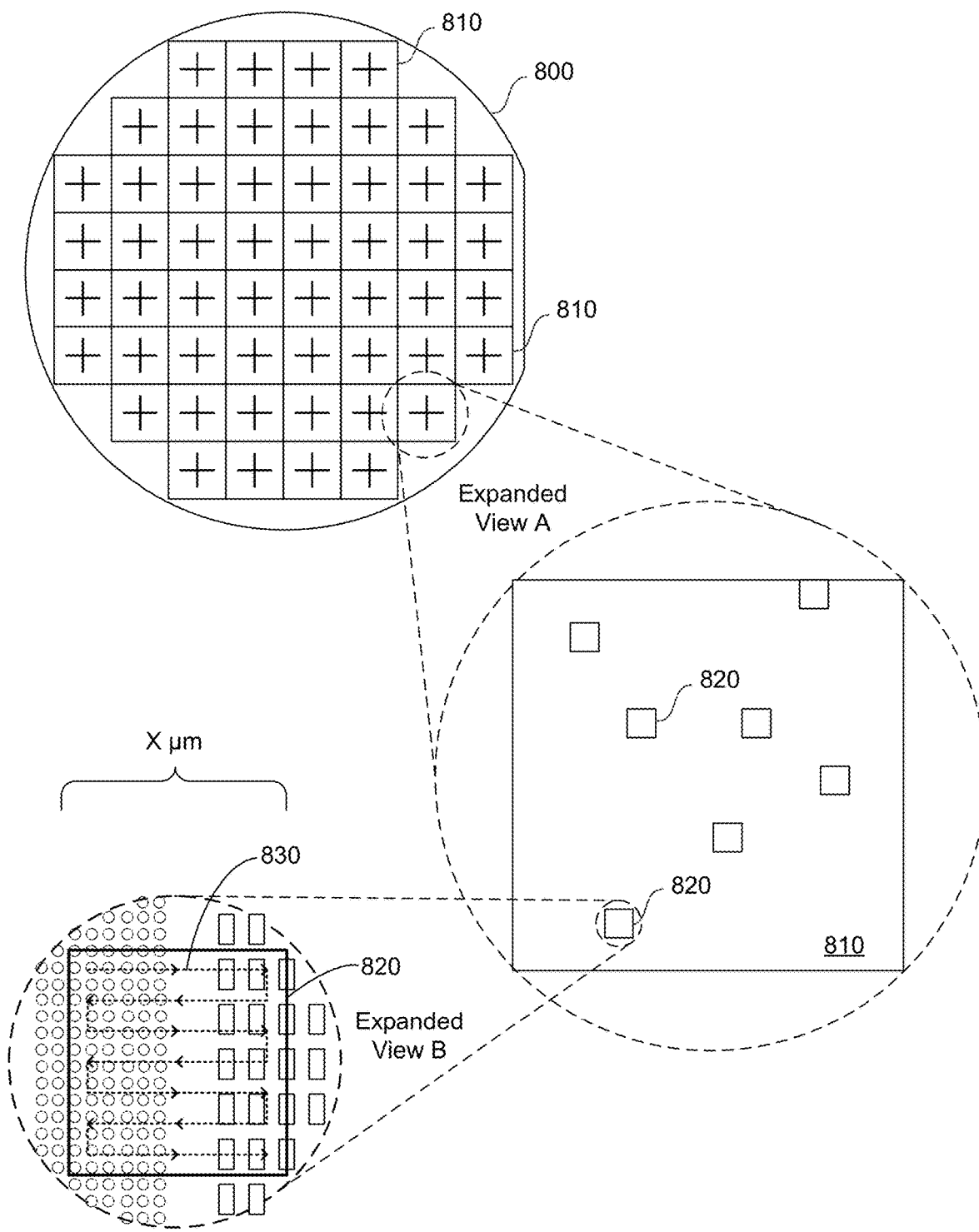
FIG. 8 is a simplified illustration of an area on a semiconductor wafer from which backscattered electrons can be collected according to some embodiments.

In order to provide context to some aspects of the embodiments set forth in the disclosure, reference is made to FIG. 8, which is a simplified illustration of an area on a semiconductor wafer that can include multiple regions at different locations on the wafer from which backscattered electrons can be collected to evaluate the sample according to some embodiments. Specifically, FIG. 8 includes a top view of wafer 800 along with two expanded views of specific portions of wafer 800. Wafer 800 can be, for example, a 200 mm or 300 mm semiconductor wafer and can include multiple integrated circuits 810 (fifty two in the example depicted) formed thereon. The integrated circuits 810 can be at an intermediate stage of fabrication and the sample evaluation techniques described herein can be used to evaluate and analyze one or more regions 820 of the integrated circuits. For example, Expanded View A of FIG. 8 depicts multiple regions 820 of one of the integrated circuits 810 that can be evaluated and analyzed according to the techniques described herein. Expanded View B depicts one of those regions 820 that includes different features formed therein.

Embodiments of the disclosure can analyze and evaluate the regions 820 using, for example, method 400 discussed above with respect to FIG. 4. The evaluating can be done by scanning the SEM beam back and forth within the region 820 according to a raster pattern, such as scan pattern 830 depicted in a simplified format in the Expanded View B of FIG. 8.

Additional Embodiments

The foregoing descriptions of the specific embodiments described herein are presented for purposes of illustration and description. They are not intended to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

Any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutatis mutandis to a system that is configured to executing instructions stored in the computer program product.

To the extent the illustrated embodiments of the present disclosure can be implemented using electronic components and circuits known to those skilled in the art, details of such are not explained in any greater extent than that considered necessary as illustrated above for the understanding and appreciation of the underlying concepts of the present disclosure and in order not to obfuscate or distract from the teachings of the present disclosure.

What is claimed is:

1. A method of evaluating a region of a sample, the method comprising:
    positioning a sample within a vacuum chamber;
    generating an electron beam with a scanning electron microscope (SEM) column that includes an electron gun at one end of the column and a column cap at an opposite end of the column;
    focusing the electron beam on the sample and scanning the focused electron beam across the region of the sample, while the SEM column is operated in tilted mode, thereby generating secondary electrons and backscattered electrons from within the region; and
    during the scanning, collecting backscattered electrons with one or more detectors while applying a negative bias voltage to the column cap to alter a trajectory of the secondary electrons preventing the secondary electrons from reaching the one or more detectors.

2. The method of evaluating a region of a sample according to claim 1 further comprising generating, from the collected backscattered electrons, image of at least a portion of the region.

3. The method of evaluating a region of a sample according to claim 1 wherein applying a negative bias to the column cap comprises applying a bias voltage between negative 50 and negative 1000 volts.

4. The method of evaluating a region of a sample according to claim 1 wherein applying a negative bias to the column cap comprises applying a bias voltage between negative 100 and negative 500 volts.

5. The method of evaluating a region of a sample according to claim 1 wherein the column cap has a conical shape with an opening at its tip and the method further comprises directing the electron beam through the opening.

6. The method of evaluating a region of a sample according to claim 1 wherein collecting backscattered electrons includes collecting the backscattered electrons with an in-lens detector and a top detector.

7. The method of evaluating a region of a sample according to claim 1 wherein collecting backscattered electrons includes collecting the backscattered electrons with an external detector.

8. A system for evaluating a region of a sample, the system comprising:
    a vacuum chamber;
    a sample support configured to hold a sample within the vacuum chamber during a sample evaluation process;
    a scanning electron microscope (SEM) column configured to direct a charged particle beam into the vacuum chamber toward the sample, the SEM column including an electron gun at one end of the column and a column cap at an opposite end of the column;
    a detector configured to detect backscattered electrons; and
    a processor and a memory coupled to the processor, the memory including a plurality of computer-readable instructions that, when executed by the processor, cause the system to:
    position a sample within a vacuum chamber;
    generate an electron beam with the scanning electron microscope (SEM) column;
    focus the electron beam on the sample and scan the focused electron beam across the region of the sample, while the SEM column is operated in tilted mode, thereby generating secondary electrons and backscattered electrons from within the region; and
    collect backscattered electrons with one or more detectors while the electron beam is scanned across the region and while applying a negative bias voltage to the column cap to alter a trajectory of the secondary electrons preventing the secondary electrons from reaching the one or more detectors.

9. The system according to claim 8 wherein the plurality of computer-readable instructions further cause the system to, when executed by the processor, generate, from the detected backscattered electrons, an image of at least a portion of the region.

10. The system according to claim 8 wherein applying a negative bias to the column cap comprises applying a bias voltage between negative 50 and negative 1000 volts.

11. The system according to claim 8 wherein applying a negative bias to the column cap comprises applying a bias voltage between negative 100 and negative 500 volts.

12. The system according to claim 8 wherein the column cap has a conical shape with an opening at its tip and the electron beam is directed through the opening.

13. The system according to claim 8 wherein the one or more detectors include an in-lens detector and a top detector.

14. The system according to claim 8 wherein the system comprises an external detector.

15. A non-transitory computer-readable memory that stores a plurality of computer-readable instructions for evaluating a region of a sample by:
    positioning a sample within a vacuum chamber;
    generating an electron beam with a scanning electron microscope (SEM) column that includes an electron gun at one end of the column and a column cap at an opposite end of the column;
    focusing the electron beam on the sample and scanning the focused electron beam across the region of the sample, while the SEM column is operated in tilted mode, thereby generating secondary electrons and backscattered electrons from within the region; and
    during the scanning, collecting backscattered electrons with one or more detectors while applying a negative bias voltage to the column cap to alter a trajectory of the secondary electrons preventing the secondary electrons from reaching the one or more detectors.

16. The non-transitory computer-readable memory set forth in claim 15 wherein the plurality of computer-readable instructions for evaluating a region of a sample further include instructions to generate, from the collected backscattered electrons, an image of at least a portion of the region.

17. The non-transitory computer-readable memory set forth in claim 15 wherein applying a negative bias to the column cap comprises applying a bias voltage between negative 50 and negative 1000 volts.

18. The non-transitory computer-readable memory set forth in claim 15 wherein applying a negative bias to the column cap comprises applying a bias voltage between negative 100 and negative 500 volts.

19. The non-transitory computer-readable memory set forth in claim 15 wherein focusing the electron beam on the sample and scanning the focused electron beam across the region of the sample comprises directing the electron beam through an opening at a tip of the column cap.

20. The non-transitory computer-readable memory set forth in claim 15 wherein collecting backscattered electrons includes collecting the backscattered electrons with an in-lens detector and a top detector.

\* \* \* \* \*